United States Patent
Li et al.

(10) Patent No.: US 6,870,184 B2
(45) Date of Patent: Mar. 22, 2005

(54) MECHANICALLY-STABLE BJT WITH REDUCED BASE-COLLECTOR CAPACITANCE

(75) Inventors: James Chingwei Li, San Diego, CA (US); Richard L. Pierson, Jr., Thousand Oaks, CA (US); Berinder P. S. Brar, Newbury Park, CA (US); John A. Higgins, Westlake Village, CA (US)

(73) Assignee: Innovative Technology Licensing, LLC, Thousand Oaks, CA (US)

( * ) Notice: Subject to any disclaimer, the term of this patent is extended or adjusted under 35 U.S.C. 154(b) by 0 days.

(21) Appl. No.: 10/631,380

(22) Filed: Jul. 30, 2003

(65) Prior Publication Data

US 2005/0023643 A1 Feb. 3, 2005

(51) Int. Cl.$^7$ ............................................... H01L 29/40
(52) U.S. Cl. ..................... 257/47; 257/197; 257/205; 257/361; 438/309; 438/235
(58) Field of Search .......................... 257/47, 197, 205, 257/361, 370, 378, 474, 477, 517, 525, 526, 539, 542, 552; 438/309, 235, 312, 189, 202, 205, 234, 170, 570, 330, 313, 340

(56) References Cited

U.S. PATENT DOCUMENTS 5,571,732 A * 11/1996 Liu ............................. 438/312

2004/0124436 A1 * 7/2004 Feng et al. ................. 257/197

* cited by examiner

Primary Examiner—David Nelms
Assistant Examiner—Long Tran
(74) Attorney, Agent, or Firm—Koppel, Jacobs, Patrick & Heybl (57) ABSTRACT

A bipolar junction transistor (BJT) requires the fabrication of a BJT structure and of a support post which is adjacent to, but physically and electrically isolated from, the BJT structure. The BJT structure includes a semi-insulating substrate, a subcollector, a collector, a base, and an emitter. Metal contacts are formed on the subcollector and emitter to provide collector and emitter terminals. Contact to the structure's base is accomplished with a metal contact which extends from the top of the support post to the edge of the base nearest the support post. The contact bridges the physical and electrical separation between the support post and the base and provides a base terminal for the device. The base contact need extend over the edge of the base by no more than the transfer length associated with the fabrication process. This results in the smaller base contact area over the collector than would otherwise be necessary, and a consequent reduction in base-collector capacitance. The invention is particularly useful when forming heterojunction bipolar transistors (HBTs), built on a compound semiconductor substrate such as indium phosphide (InP).

21 Claims, 10 Drawing Sheets

MECHANICALLY-STABLE BJT WITH REDUCED BASE-COLLECTOR CAPACITANCE

BACKGROUND OF THE INVENTION

1. Field of the Invention

This invention relates to the field of bipolar junction transistor (BJT) structures, and particularly to BJT structures which reduce base-collector capacitance.

2. Description of the Related Art

The RF performance of a BJT is determined by the minority carrier transit times through the base and collector, and the charging times associated with the base-emitter, base-collector, and parasitic diode junctions. Since the transit times are easily improved by thinning the base and collector layers or by changing their composition, much effort has been devoted to the reduction of the charging times. This is particularly important for devices designed for operation at very high frequencies, such as those based on compound semiconductors such as indium phosphide (InP).

Figure 1:
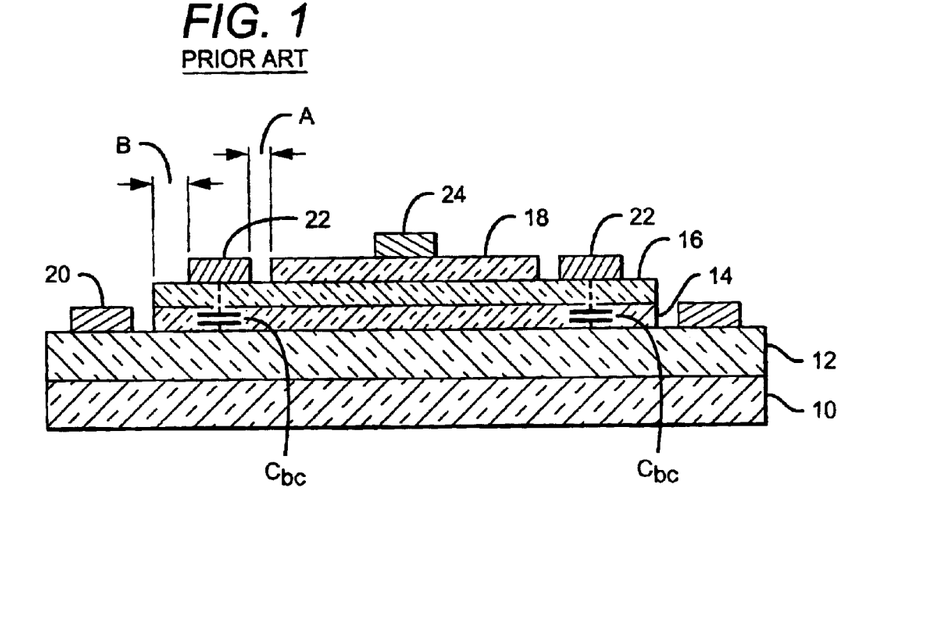
FIG. 1 is a sectional view of a known BJT structure.

The charging times are determined by the capacitance present at each junction. For a compound semiconductor-based transistor, the base-emitter and parasitic capacitances are already reasonably low. Therefore, reducing base-collector capacitance has been a primary focus. A conventional "triple-mesa" BJT structure is shown in FIG. 1 to illustrate the problem of base-collector capacitance. A substrate 10 supports a subcollector layer 12, which in turn supports a collector layer 14, a base layer 16, and an emitter layer 18. One or more metal contacts 20 are formed on subcollector 12 to provide a collector terminal, metal contacts 22 are formed on base 18 to provide a base terminal, and a metal contact 24 on emitter 18 provides an emitter terminal. A base-collector capacitance $C_{bc}$ exists below base contacts 22, the value of which increases with the amount of base contact area that is directly above collector 14.

There are typically a set of rules which govern the fabrication process used to produce a device such as that shown in FIG. 1. These rules often mandate certain minimum distances between device features, which are needed to ensure the fabrication of a functional, reliable device. For example, a minimum distance "A" might be required between emitter 18 and base contact 22 (referred to as the "ledge width"), and a minimum distance "B" might be specified between base contact 22 and the edge of the base. These rules result in there being a significant base contact area above collector 14, and thus a significant base-collector capacitance $C_{bc}$.

Figure 2:
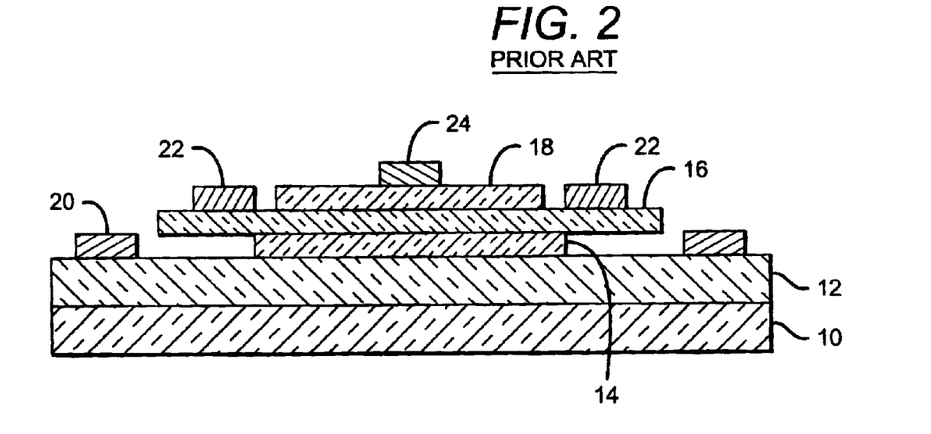
FIG. 2 is a sectional view of a known BJT structure, the collector of which has been undercut to reduce base-collector capacitance.

One technique for reducing base-collector capacitance is the "collector undercut", in which a portion of the collector 14 beneath the base is etched away, as illustrated in FIG. 2. Because the dielectric constant of air is much lower than that of the collector material, the undercut has the effect of reducing base-collector capacitance. However, the undercut leaves the base and/or base contact cantilevered over the resulting empty space, leaving the overhanging edges of the base susceptible to breakage. Subsequent processing steps may also break the base cantilever. Such damage is likely to render the device useless.

SUMMARY OF THE INVENTION

A BJT and fabrication method are described which overcome the problems noted above. Base-collector capacitance is reduced by reducing the area of the base contact which is directly over the collector, while maintaining the mechanical stability of the device.

The invention requires the fabrication of a BJT structure, and of a support post which is adjacent to, but physically and electrically isolated from, the BJT structure. The BJT structure is built on a semi-insulating substrate, and includes (from bottom to top) a subcollector, a collector, a base, and an emitter. Metal contacts are formed on the subcollector and emitter to provide collector and emitter terminals, respectively.

Contact to the BJT structure's base is accomplished via a metal contact which extends from the top of an adjacent support post to the edge of the base nearest the support post. The contact thus bridges the physical and electrical separation between the support post and the base and provides a base terminal for the BJT.

Because a portion of the base contact is supported by the support post, the contact need only extend over the edge of the base by a small amount, which results in a smaller base contact area over the collector than would otherwise be necessary, and a consequent reduction in base-collector capacitance.

The support post (or posts) are preferably created by etching a vertical gap through the material layers used to form the BJT structure, thereby physically and electrically isolating the support posts from the BJT structure. The invention is particularly useful when forming heterojunction bipolar transistors (HBTs), built on a compound semiconductor substrate such as indium phosphide (InP).

Further features and advantages of the invention will be apparent to those skilled in the art from the following detailed description, taken together with the accompanying drawings.

DETAILED DESCRIPTION OF THE INVENTION

Figure 3A:
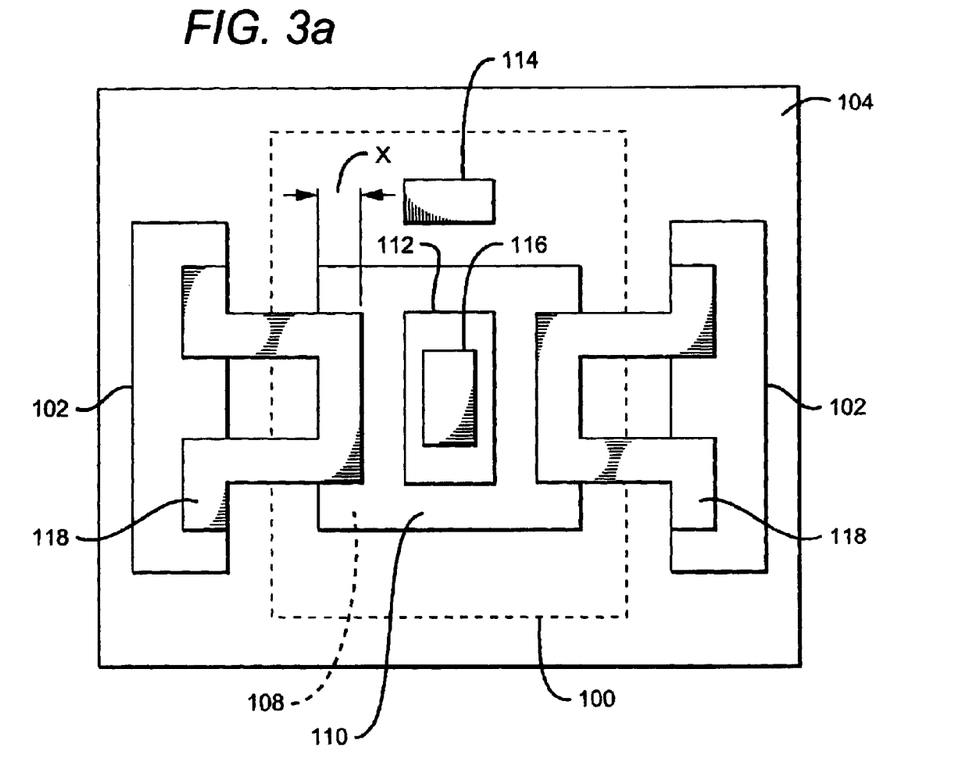
FIGS. 3a and 3b are plan and sectional views, respectively, of a BJT per the present invention.

An exemplary embodiment of a mechanically-stable BJT with reduced base-collector capacitance is shown in FIGS. 3a (plan view) and 3b (corresponding sectional view). The device comprises a BJT structure 100 and at least one support post 102. BJT structure 100 comprises a semi-insulating substrate 104, on top of which is formed a subcollector layer 106 (not shown in FIG. 3a for clarity). A collector layer 108 is on the subcollector, a base layer 110 is atop the collector, and an emitter 112 is formed on the base. A metal contact 114 (not visible in FIG. 3b) is formed on subcollector 106 to provide a collector terminal for the BJT, and a metal contact 116 on emitter 112 provides the device's emitter contact.

Figure 3B:
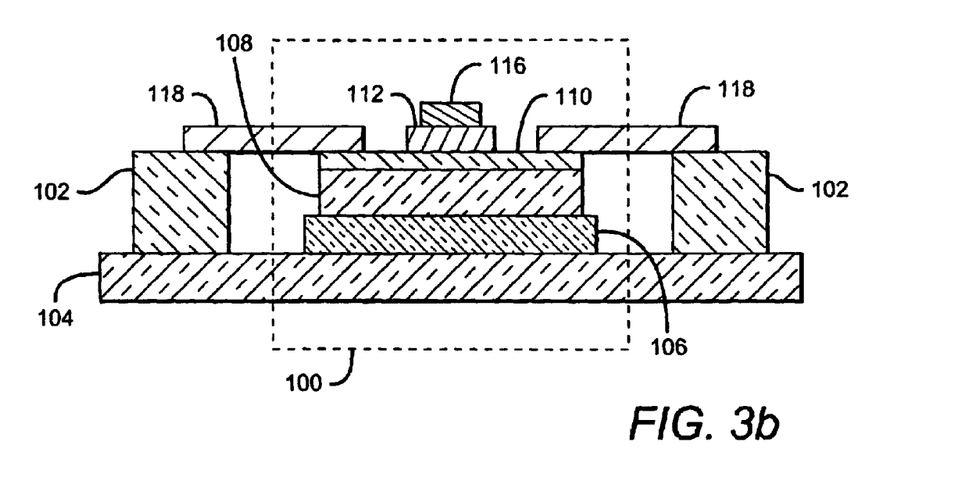

Support post 102 is formed adjacent to BJT structure 100, but is physically and electrically isolated from the BJT structure. A metal contact 118 is formed which extends from the top of the support post to the nearest edge of base 110, thereby bridging the physical and electrical separation between the support post and the base and providing a base terminal for the BJT.

When properly arranged, this structure significantly reduces the base-collector capacitance present in a structure such as that shown in FIG. 1, while providing the mechanically stability that is lacking in a structure such as that shown in FIG. 2. The emitter 112 is preferably placed tightly within the perimeter of base 110; this allows the base to be smaller and greatly reduces the base-collector diode area and thus the base-collector capacitance.

The structure also improves base-collector capacitance by moving a portion of the base-collector area which was previously devoted to the base metal contact over to support post 102, and then forming base contact 118 so that it extends just over the edge of base 110. Preferably, the base contact is formed so that it extends over the edge of the base by about X $\mu$m, where X is the "transfer length" associated with the process used to fabricate the device. "Transfer length" is a technology-specific dimension which helps define the minimum overlap distance with which a contact must encroach on a conducting layer in order to ensure a reliable low resistance connection; it is typically on the order of 0.5 $\mu$m.

In addition to its positive effect on base-collector capacitance, support post 102 also provides the device a high degree of structural integrity. Here, there is no severe collector undercut and resulting damage-prone cantilevered base. Instead, by reducing the area of base contact 118 over collector 108, the present structure effectively reduced base-collector capacitance, but does so without cantilevering the base.

There are preferably two support posts 102, located on opposite sides of BJT structure 100, each with a base contact 118 extending between the post and the nearest edge of base 110.

The support posts 102 are preferably fabricated simultaneously with BJT structure 100, and comprise the same material layers as make up the BJT. That is, each support post preferably comprises layers made from the same material layers from which subcollector 106, collector 108, and base 110 were formed. This support post structure is preferred due to the ease with which it may be fabricated: the material layers needed to form the BJT are deposited in sequence, and then both the support posts and the BJT structure are formed from the same stack of material layers. Once the material layers are deposited, one or more vertical gaps are etched down to substrate 104 to provide the physical and electrical separation needed between the support posts and BJT structure 100. Note that it is not essential that the support posts be fabricated from the same material layers from which the BJT structure is formed; however, this is the most efficient method of providing the posts, and is thus preferred.

When the support posts are fabricated as described above, each post will have its own intrinsic base-collector diode and base-collector capacitance. However, because the support posts are electrically isolated from the BJT structure, their base-collector capacitances are not seen by the BJT, and thus have no adverse effect on device performance.

Base contacts 118 are preferably "comb"-shaped—i.e., having a continuous top portion and two or more periodically-spaced "teeth" which extend perpendicularly from the top portion. As shown in FIG. 3a, the top portions of contacts 118 contact the edges of base 110, and the contacts' teeth extend across the gap to the support posts. This base contact shape enables the support posts to be formed, as the openings between the teeth provide access to an etchant, preferably a wet etchant, to remove the material between posts 102 and BJT structure 100, and thereby form the posts.

By reducing base-collector capacitance, the present BJT structure is particularly well-suited to transistors used in RF applications, the performance of which can be degraded by such capacitance. Such devices are generally fabricated on a compound semiconductor substrate, and are thus heterojunction bipolar transistors (HBTs). For an HBT in accordance with the present invention, semi-insulating substrate 104 is preferably indium phosphide (InP). Subcollector 106 is preferably InP or indium gallium arsenide (InGaAs), and collector 108 is preferably InP, InGaAs, indium aluminum arsenide (InAlAs), or indium aluminum arsenide phosphide (InAlAsP). The base layer 110 is preferably InGaAs, and emitter 112 is preferably InP or InAlAs. There may also be an emitter "cap" (not shown) over the emitter which lowers emitter contact resistance, that is preferably InP, InGaAs, or InAlAs.

Figure 4:
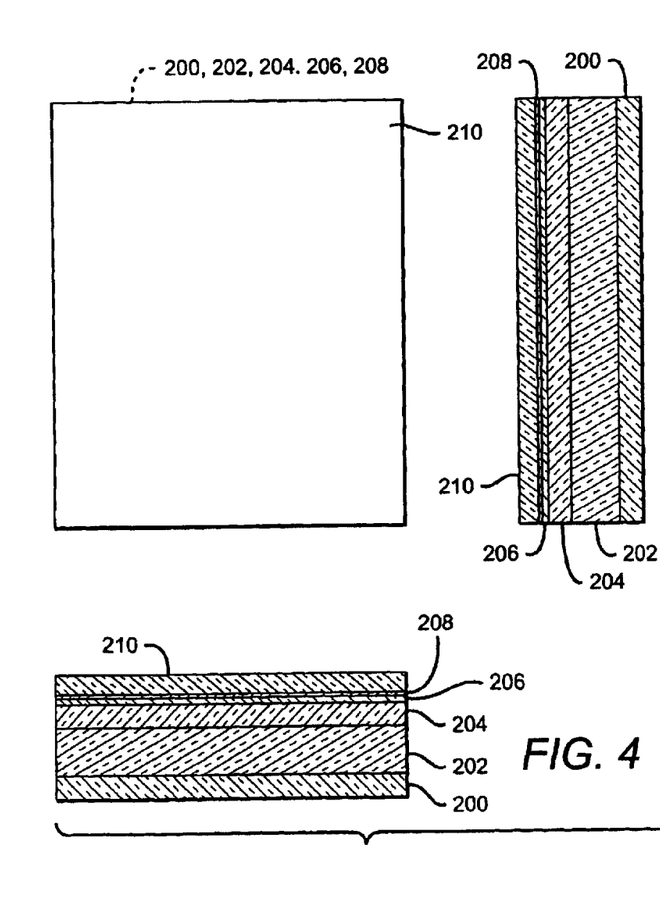
FIGS. 4–13 are isometric views which illustrate a set of process steps which could be used to fabricate a BJT per the present invention.

A preferred process sequence which could be used to fabricate the present BJT is shown in FIGS. 4–13, each of which depicts plan, front sectional, and side sectional isometric views. In FIG. 4, each of the starting material layers is deposited: a substrate layer 200, a subcollector layer 202, a collector layer 204, a base layer 206, an emitter layer 208 and, optionally, an emitter cap layer 210.

Figure 5:
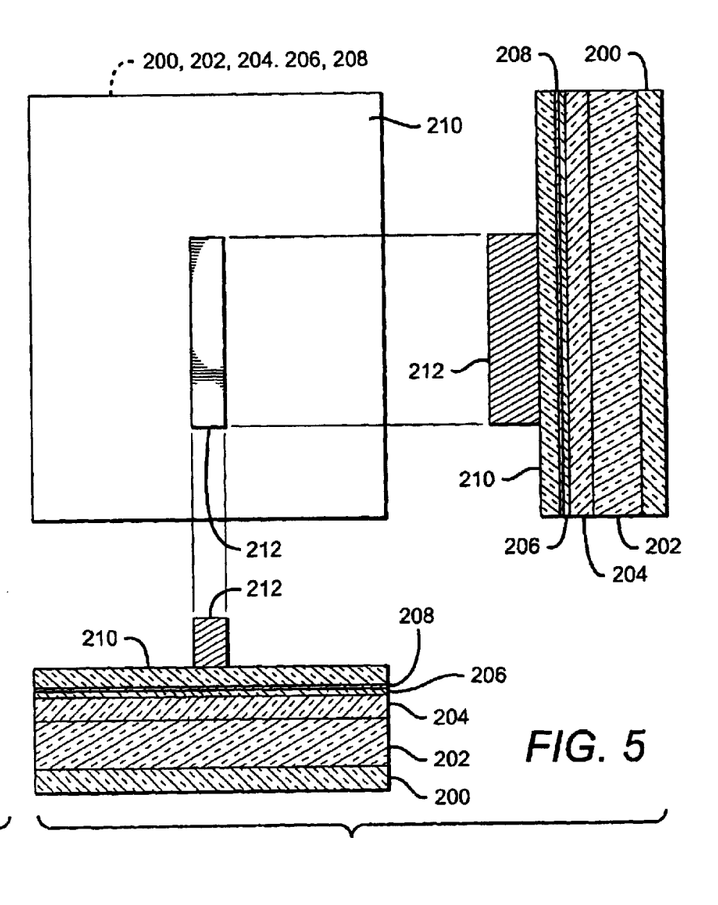
Figure 6:
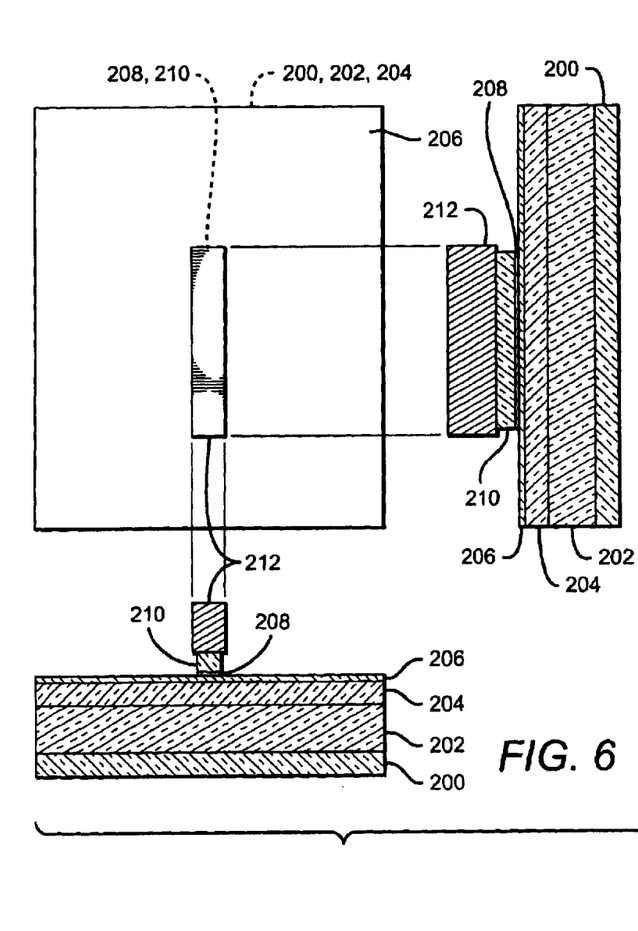

In FIG. 5, a metal layer has been deposited, patterned, and etched to form an emitter contact 212, and in FIG. 6, emitter layer 208 and emitter cap layer 210 are patterned and etched to complete the fabrication of the device's emitter.

Figure 7:
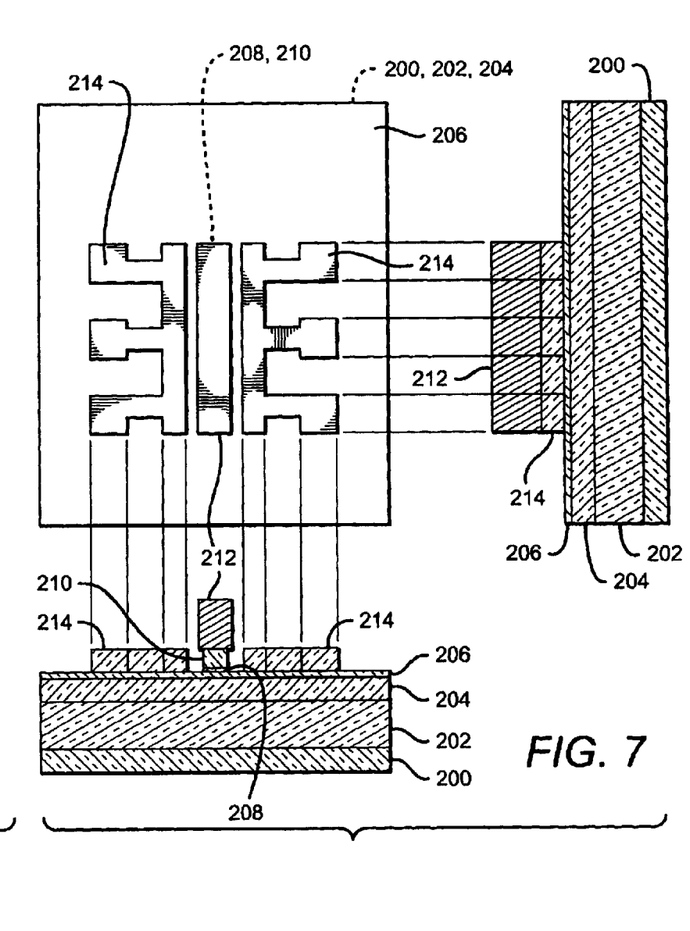

In FIG. 7, a metal layer has been deposited, patterned, and etched to form base contacts 214. As noted above, base contacts 214 are preferably comb-shaped, to enable material to be removed to form the physically separate support posts (described below).

Figure 8:
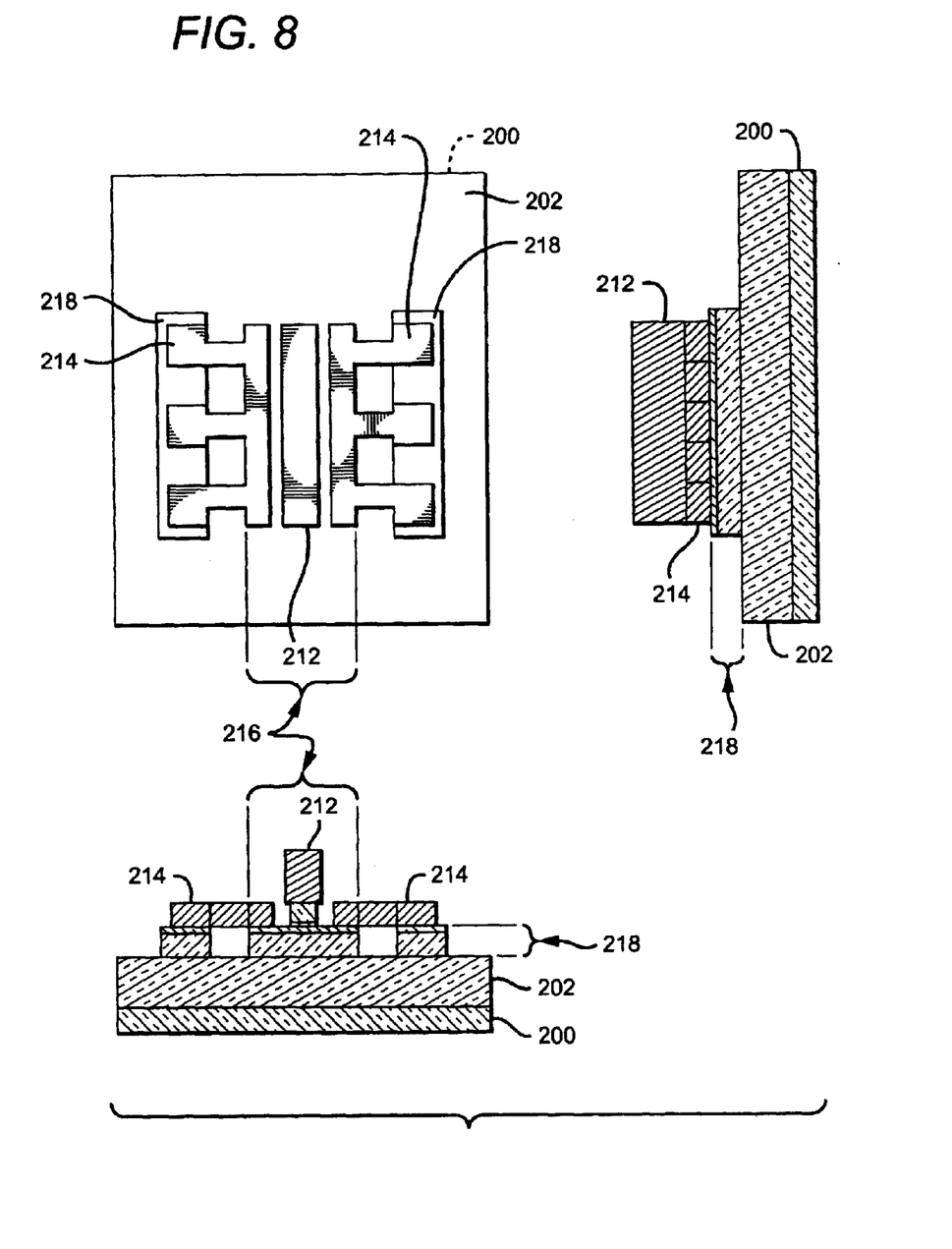

In FIG. 8, base layer 206 and collector layer 208 are patterned and etched to remove material from beneath base contacts 214 and to partially define the BJT structure 216 and support posts 218 of the final device. The material below base contacts 214 is preferably removed using a wet etchant such as HCl:H$_3$PO$_4$:H$_2$O::1:1:1 (if collector material is InP), or H$_2$SO$_4$:H$_2$O$_2$:H$_2$O::8:1:160 (for an InGaAs collector). An etch stop layer is preferably used on subcollector layer 202. The wet etch etches down and laterally, so that the gap between BJT structure 216 and support posts 218 is likely to be wider near the top of the post, then gradually taper down to a narrower gap at the surface of substrate 200.

Figure 9:
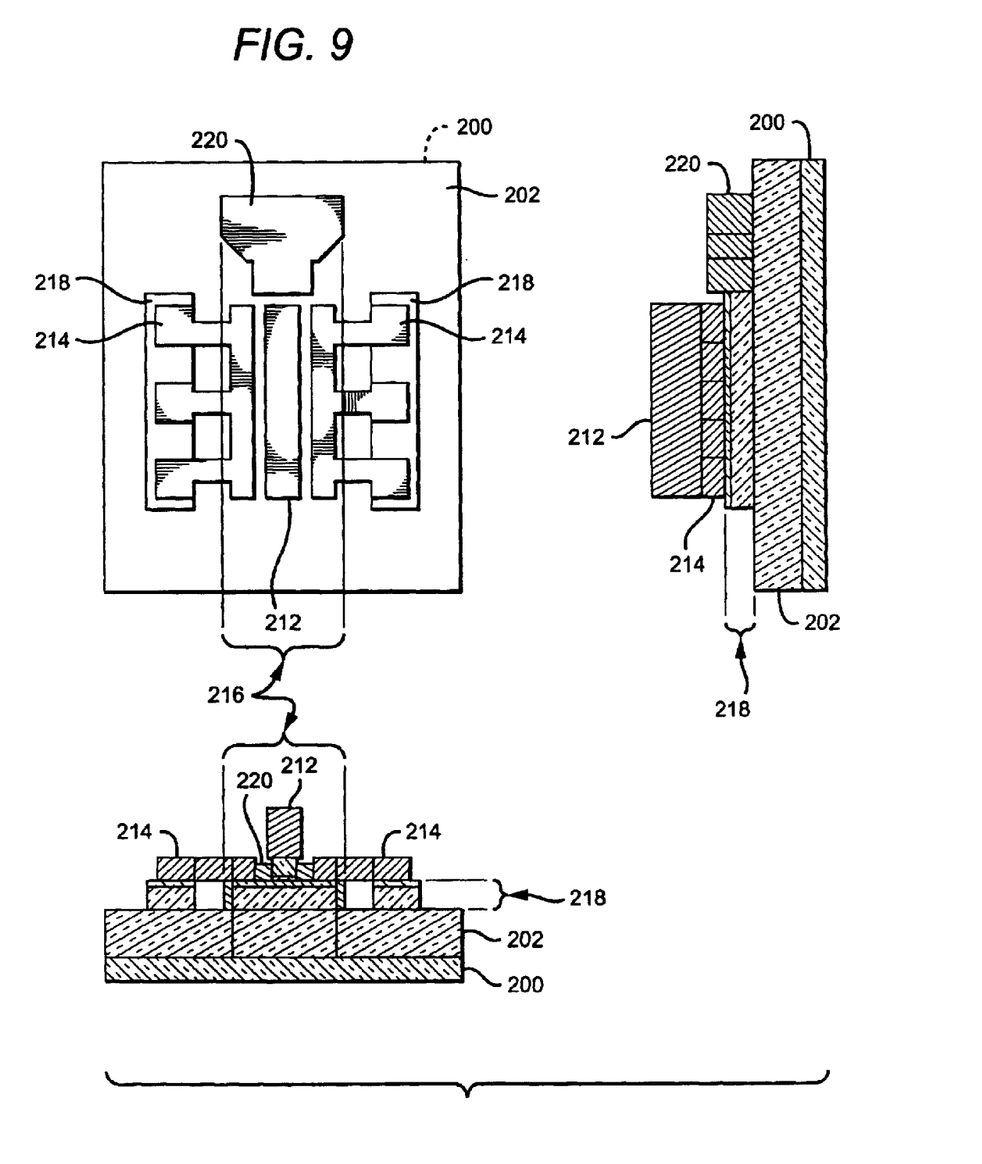
Figure 10:
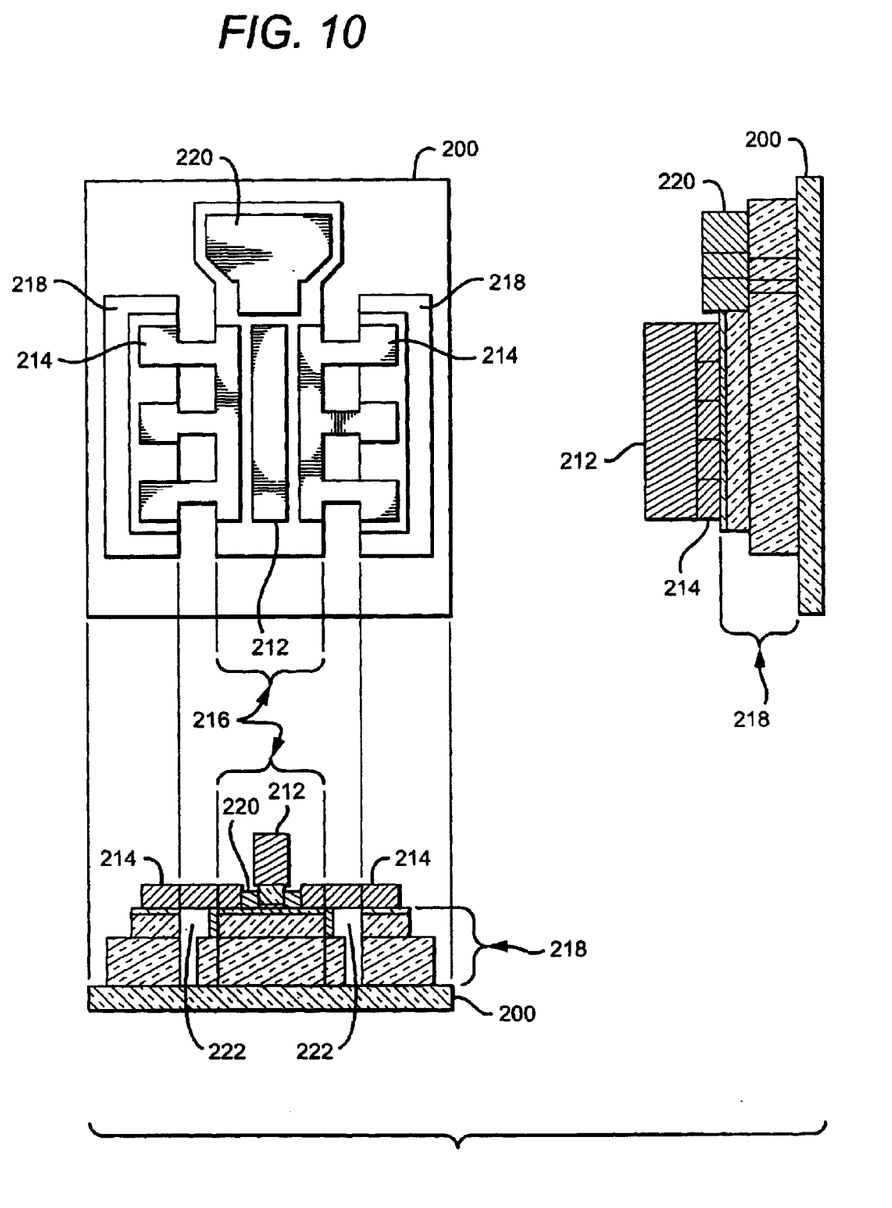
Figure 11:
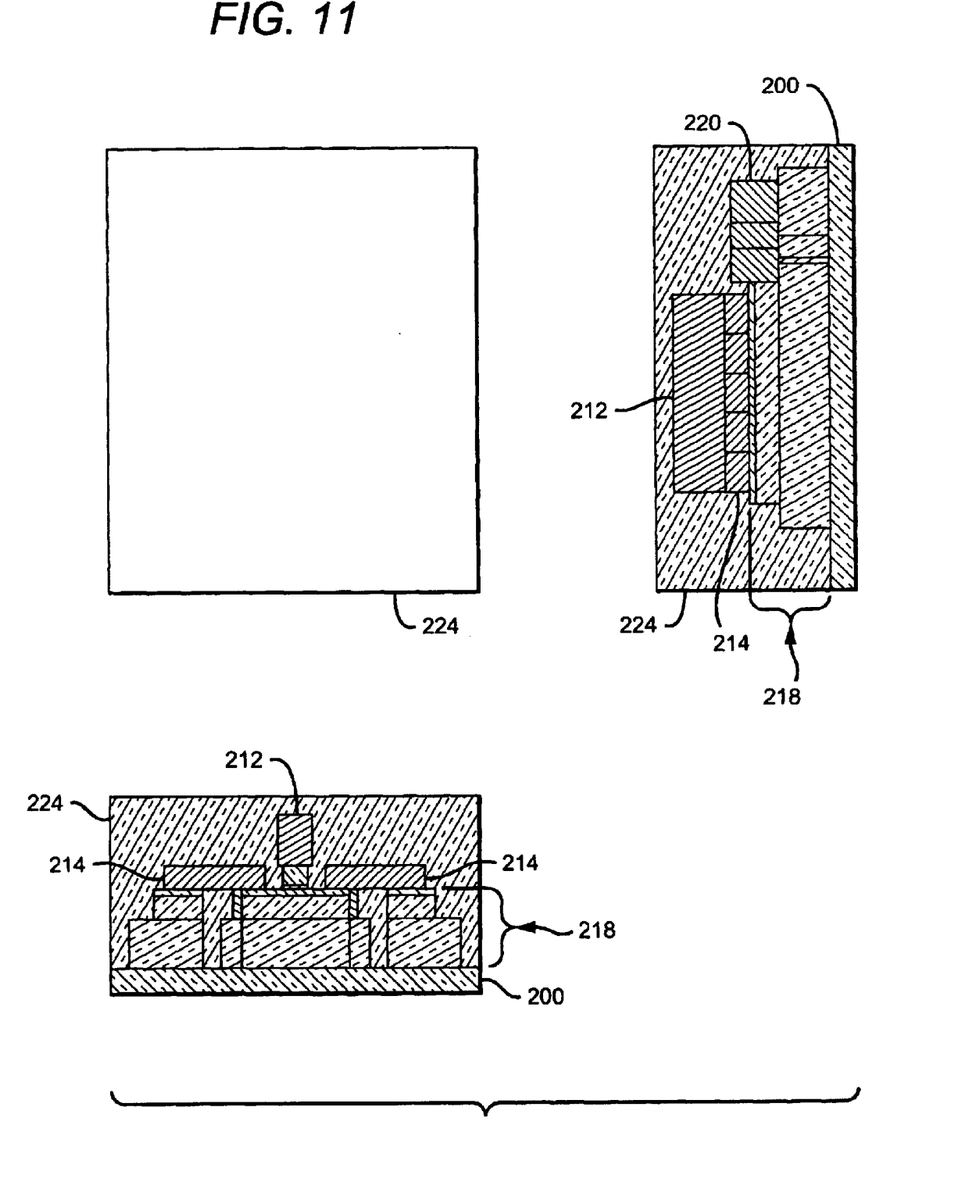
Figure 12:
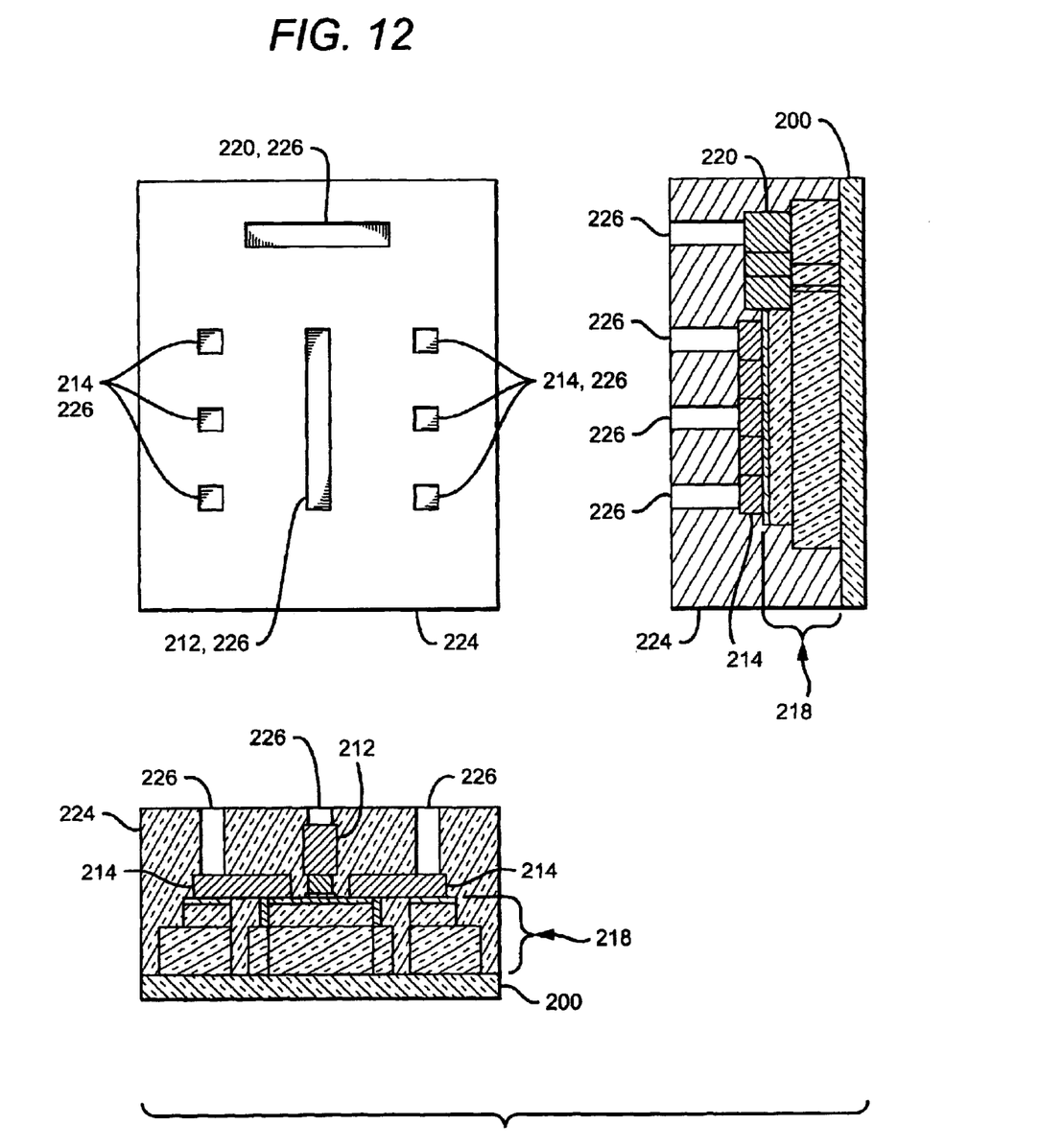

In FIG. 9, a metal layer is deposited, patterned, and etched to form a collector contact 220, and in FIG. 10, subcollector layer 202 is patterned and etched to remove additional material from beneath base contacts 214 and to complete the definition of BJT structure 216 and support posts 218, preferably using a wet etchant such as those identified above. An etch stop layer is preferably used on substrate layer 200. This completes the fabrication of the basic device, which includes BJT structure 214 and support posts 218. Material has been removed under base contacts 214 down to substrate 200, thereby providing vertical gaps 222 which physically and electrically isolate support posts 218 from BJT structure 216.

Figure 13:
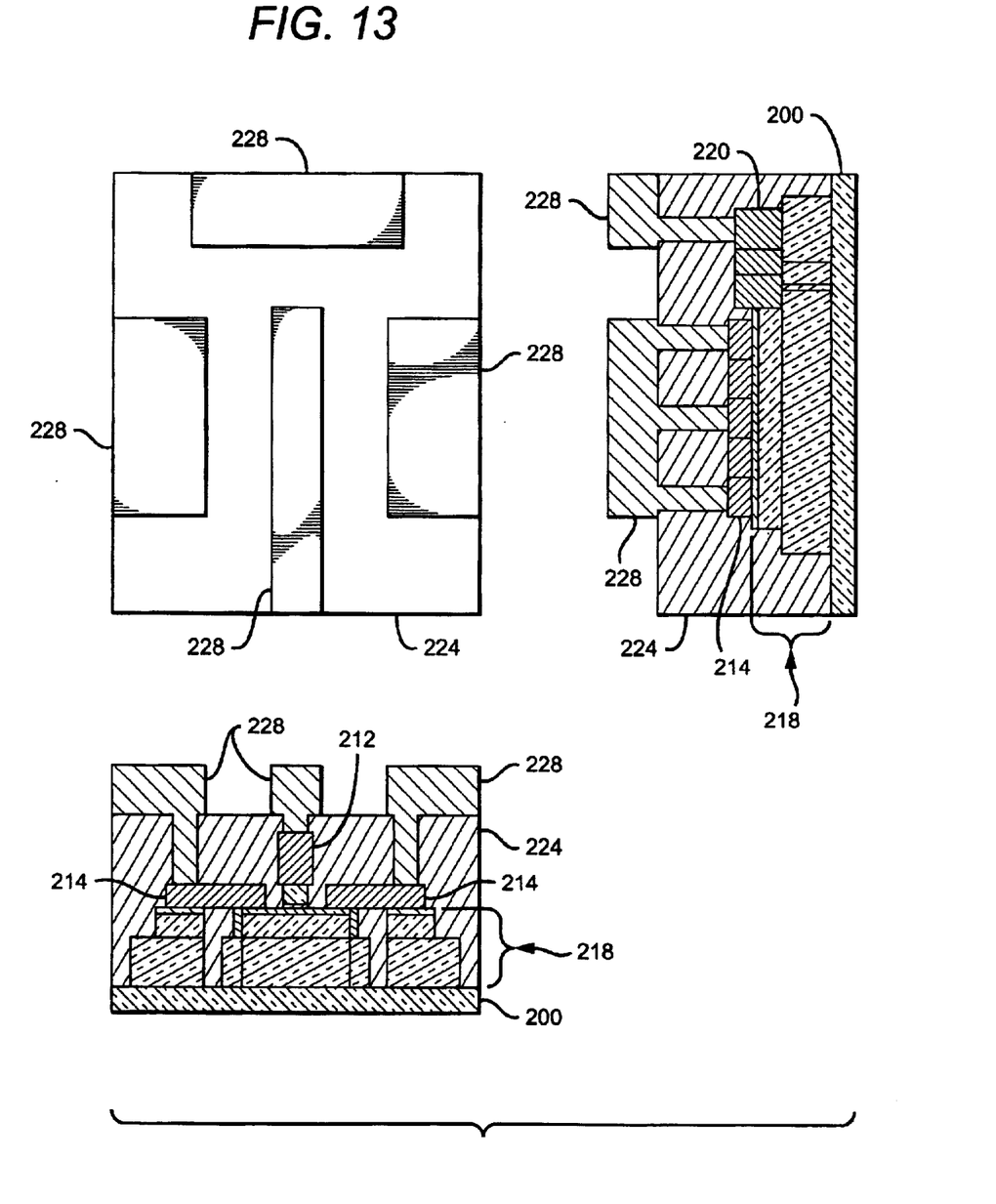

Additional process steps are required to provide interconnections to the basic device. For example, in FIG. 11, an inter-level dielectric layer 224 is deposited over the basic device, and in FIG. 12, vias 226 are patterned and etched in dielectric layer 224 to provide access to the device's buried base, emitter and collector contacts. In FIG. 13, a metal layer 228 is deposited, patterned and etched to provide metal interconnects to the device.

The process sequence depicted in FIGS. 4–13 shows only one method of fabricating a device in accordance with the present invention. Many other processes might be employed to produce the required BJT structure and base contact support post.

While particular embodiments of the invention have been shown and described, numerous variations and alternate embodiments will occur to those skilled in the art. Accordingly, it is intended that the invention be limited only in terms of the appended claims.

We claim:

1. A bipolar junction transistor (BJT), comprising:
   a BJT structure, comprising:
      a semi-insulating substrate,
      a subcollector formed on said substrate,
      a collector formed on said subcollector,
      a first metal contact on said subcollector which provides a collector contact for said BJT,
      a base formed on said collector,
      an emitter formed on said base,
      a second metal contact on said emitter which provides an emitter contact for said BJT;
   a first support post formed on said substrate which is physically and electrically isolated from said BJT structure; and
   a third metal contact which extends from the top of said support post to the edge of said base nearest said support post, thereby bridging the physical and electrical separation between said first support post and said base and providing a base contact for said BJT.

2. The BJT of claim 1, wherein said semi-insulating substrate is a compound semiconductor.

3. The BJT of claim 1, wherein said semi-insulating substrate comprises indium phosphide (InP).

4. The BJT of claim 1, wherein said base contact extends over the edge of said base by about X $\mu$m, where X is the transfer length associated with the process used to fabricate the BJT.

5. The BJT of claim 1, wherein said support post is formed simultaneously with said BJT structure, said support post comprising:
   a first layer on said substrate, said first layer comprising the material which comprises said subcollector;
   a second layer on said first layer, said second layer comprising the material which comprises said collector; and
   a third layer on said second layer, said third layer comprising the material which comprises said base.

6. The BJT of claim 1, wherein said base contact is approximately comb-shaped having a top portion and periodically-spaced teeth extending perpendicularly from said top portion, said top portion of said comb-shaped base contact contacting said base and said teeth extending from said top portion to said first support post.

7. The BJT of claim 1, further comprising:
   a second support post formed on said substrate which is physically and electrically isolated from said BJT structure and is located on the opposite side of said BJT structure from said first support post; and
   a fourth metal contact which extends from the top of said second support post to the edge of said base nearest said support post, thereby bridging the physical and electrical separation between said second support post and said base and providing a second base contact for said BJT.

8. The BJT of claim 1, wherein said subcollector comprises indium phosphide (InP) or indium gallium arsenide (InGaAs).

9. The BJT of claim 1, wherein said collector comprises indium phosphide (InP), indium gallium arsenide (InGaAs), indium aluminum arsenide (InAlAs), or indium aluminum arsenide phosphide (InAlAsP).

10. The BJT of claim 1, wherein said base comprises indium gallium arsenide (InGaAs).

11. The BJT of claim 1, wherein said emitter comprises indium phosphide (InP) or indium aluminum arsenide (InAlAs).

12. The BJT of claim 1, wherein said semi-insulating substrate is a compound semiconductor and said BJT structure is arranged to form a heterojunction bipolar transistor (HBT).

13. A heterojunction bipolar transistor (HBT), comprising:
   an HBT structure, comprising:
      a semi-insulating substrate comprising a compound semiconductor,
      a subcollector formed on said substrate,
      a collector formed on said subcollector,
      a first metal contact on said subcollector which provides a collector contact for said HBT,
      a base formed on said collector,
      an emitter formed on said base,
      a second metal contact on said emitter which provides an emitter contact for said HBT;
   a first support post formed on said semi-insulating substrate which is physically and electrically isolated from said HBT structure, said first support post comprising:
      a first layer on said substrate, said first layer comprising the material which comprises said subcollector;
      a second layer on said first layer, said second layer comprising the material which comprises said collector; and
      a third layer on said second layer, said third layer comprising the material which comprises said base; and
   a third metal contact which extends from the top of said support post to the edge of said base nearest said support post, thereby bridging the physical and electrical separation between said support post and said base and providing a base contact for said HBT, said base contact extending over the edge of said base by about X $\mu$m, where X is the transfer length associated with the process used to fabricate the HBT.

14. The HBT of claim 13, wherein said semi-insulating substrate comprises indium phosphide (InP).

15. The HBT of claim 13, wherein said base contact is approximately comb-shaped having a top portion and periodically-spaced teeth extending perpendicularly from said top portion, said top portion of said comb-shaped base contact contacting said base and said teeth extending from said top portion to said first support post.

16. The HBT of claim 13, further comprising:
   a second support post formed on said substrate which is physically and electrically isolated from said HBT structure and is located on the opposite side of said HBT structure from said first support post; and
   a fourth metal contact which extends from the top of said second support post to the edge of said base nearest said support post, thereby bridging the physical and electrical separation between said second support post and said base and providing a second base contact for said HBT.

17. The HBT of claim 13, wherein said subcollector comprises indium phosphide (InP) or indium gallium arsenide (InGaAs).

18. The HBT of claim 13, wherein said collector comprises indium phosphide (InP), indium gallium arsenide (InGaAs), indium aluminum arsenide (InAlAs), or indium aluminum arsenide phosphide (InAlAsP).

19. The HBT of claim 13, wherein said base comprises indium gallium arsenide (InGaAs).

20. The HBT of claim 13, wherein said emitter comprises indium phosphide (InP) or indium aluminum arsenide (InAlAs).

21. A heterojunction bipolar transistor (HBT), comprising:
- an HBT structure, comprising:
  - a semi-insulating substrate comprising indium phosphide (InP),
  - a subcollector formed on said substrate,
  - a collector formed on said subcollector,
  - a first metal contact on said subcollector which provides a collector contact for said HBT,
  - a base formed on said collector,
  - an emitter formed on said base,
  - a second metal contact on said emitter which provides an emitter contact for said HBT;
- first and second support posts formed on said semi-insulating substrate on opposite sides of said HBT structure, each of said support posts physically and electrically isolated from said HBT structure, each of said support posts comprising:
  - a first layer on said substrate, said first layer comprising the material which comprises said subcollector;
  - a second layer on said first layer, said second layer comprising the material which comprises said collector; and
  - a third layer on said second layer, said third layer comprising the material which comprises said base;
- a third metal contact which extends from the top of said first support post to the edge of said base nearest said first support post, thereby bridging the physical and electrical separation between said first support post and said base and providing a first base contact for said HBT; and
- a fourth metal contact which extends from the top of said second support post to the edge of said base nearest said second support post, thereby bridging the physical and electrical separation between said second support post and said base and providing a second base contact for said HBT;
- wherein each of said base contacts is approximately comb-shaped having a top portion and periodically-spaced teeth extending perpendicularly from said top portion, the top portion of said first base contact contacting a first edge of said base and the top portion of said second base contact contacting an edge of said base opposite said first edge and said teeth extending from the top portions of said first and second base contacts to said first and second support posts, respectively, with each of said base contacts extending over the edge of said base by about $X\,\mu m$, where $X$ is the transfer length associated with the process used to fabricate the HBT.

* * * * *